United States Patent [19]
Phelps

[11] Patent Number: 5,724,234
[45] Date of Patent: Mar. 3, 1998

[54] SLOTTED SHIELD CAN

[75] Inventor: Craig A. Phelps, Raleigh, N.C.

[73] Assignee: Ericsson Inc., Research Triangle Park, N.C.

[21] Appl. No.: 641,880

[22] Filed: May 2, 1996

[51] Int. Cl.⁶ ................................................ H05K 9/00
[52] U.S. Cl. .......................... 361/816; 361/220; 361/730; 361/753; 361/799; 361/800; 361/801; 361/814; 361/818; 174/35 R
[58] Field of Search ................................ 361/212, 220, 361/814, 816, 818, 800, 728, 730, 748, 752, 753, 796, 799, 801; 174/35 R, 35 GC

[56]      References Cited

U.S. PATENT DOCUMENTS 5,045,973   9/1991   Saarela et al. .

FOREIGN PATENT DOCUMENTS 8-070195 A   3/1996   Japan .
22 09 436    5/1989   United Kingdom .
22 69 940    2/1994   United Kingdom .
22 85 181    6/1995   United Kingdom .

*Primary Examiner*—Leo P. Picard
*Assistant Examiner*—Phuong T. Vu
*Attorney, Agent, or Firm*—Robert A. Samra

[57]      ABSTRACT

A shield can for radio frequency (RF) shielding of electronic circuitry mounted on or embedded in the surface of an insulating substrate such as a printed circuit board (PCB). The design of the shield can allows it to conform to variations in the surface of the PCB. The shield can, which is usually formed of metal, includes a top and a plurality of side walls dimensioned to completely cover the electronic circuitry when the shield can is placed over the circuitry. According to the present invention, any of the sides of the shield can may be made to conform to the surface of the PCB (and to effectively contact a ground trace on the PCB) by providing a plurality of vertical slots in the side. The slotted side would then have a series of metal teeth each of which can be displaced angularly to the extent required to conform to the PCB when a modest force is applied to the top of the shield can.

31 Claims, 2 Drawing Sheets

SLOTTED SHIELD CAN

BACKGROUND OF THE INVENTION

1. Field of the Invention

The present invention relates to radio frequency (RF) shielding of electronic components or circuitry mounted on, or embedded in, printed circuit boards (PCBs) and, more specifically, to the use of stamped or formed metal shielding devices, known as shield cans, for RF shielding in PCBs. Even more specifically, the present invention relates to a method of and an apparatus for obtaining uniform or uninterrupted contact between a shield can and a PCB when the contact surfaces of the shield can and the PCB are not coplanar.

2. Related Prior Art

Printed circuit boards (PCBs) are widely used in the electronics and telecommunications industry. PCBs generally consist of one or more layers of an insulating substrate (e.g., plastic) on which an electrical circuit is formed by depositing a predetermined pattern of a conducting metal (e.g., copper) for connecting various electronic components (e.g., semiconductors) which are mounted on or etched in the PCB layers. Many of these electrical circuits include components which operate at a high radio frequency (RF). The RF emissions from these components can interfere with the proper operation of other components or circuits in the vicinity of the PCB (e.g., other PCBs within a personal computer). Thus, it is important to block or shield these RF emissions in order to prevent RF interference.

An early technique for RF shielding sought to enclose the entire PCB within a grounded metal box. This approach, however, adds considerable weight and bulk to the PCB and prevents easy access to the associated electrical circuit during testing or repair. Thus, another early technique for RF shielding used an open metal box which was placed on one or both sides of the PCB and was attached or otherwise connected to a ground path or trace on the surface of the PCB.

These early approaches to RF shielding could be termed excessive as they attempted to shield the entire PCB even if the source of the radio interference was only a small portion or section of the PCB circuit. Hence, the current approach has been to use a metal "shield can," generally in the shape of an inverted open box, to cover the specific portion of the circuitry in or on the PCB which is causing the interference. The shield can is usually applied to the appropriate section of the PCB either by soldering or forced galvanic engagement. Many of the shield cans currently in use have small openings in the sides (walls) or at the corners between two adjacent walls. The openings in the sides are typically circular and provide for effective air flow during reflow soldering. The openings at the corners usually extend the height of the walls and are a result of the use of a simple method of forming the shield can by bending the edges of a flat piece of metal to form the walls or sides of the can.

For proper and effective RF shielding, it is desired that the shield can make uniform contact, or conform as much as possible, with the PCB. It is known, for example, that there will be little or no shielding of RF energy at a particular frequency if the size of any gap between the shield can and the PCB is equal to or greater than the wavelength of that frequency and, further, that the amount of RF energy which will leak through any gap that is smaller in size than the wavelength will decrease linearly with the decrease in the size of the gap. It is also generally believed that, to avoid significant leakage of RF energy at any frequency of interest, the gap size should be no more than 1/20 of the wavelength of that frequency. Accordingly, if it is desired to shield RF energy at 100 MHz or 1 GHz, the dimensions (length or width) of any gap should not be larger than approximately 6 or 0.6 inches, respectively (where the wavelength of each of these frequencies can be calculated as the speed of light in a vacuum, which is 186,000 miles per second, divided by the frequency in cycles per second or Hertz).

Thus, the elimination or reduction of gaps between the shield can and the PCB is an important objective of the design of an effective shield can. However, unless the contacting surfaces of the shield can and the PCB are perfectly coplanar, there will be areas around the perimeter of the shield can where contact between the shield can and the PCB is not made resulting in gaps of different sizes, at least some of which sufficiently large to threaten the effectiveness of the shield can in blocking RF emissions.

In practice, it is not economically feasible to produce shield cans and PCBs which are perfectly coplanar. Instead, conventional shield cans are economically formed as described above with circular openings in the sides and vertical openings along the corners, but with no assurance of uniform contact between the shield can and the PCB. Hence, the industry has been confronted with the problem of ensuring uniform contact between the shield cans and the PCBs.

Heretofore, several techniques have been attempted for conforming the contact surfaces of the shield can and PCB to one another. These techniques include, for example, the application of secondary solder to close gaps left from the first soldering of the shield can to the PCB, and gasketing between the shield can and the PCB. Each of these prior art solutions, however, is accompanied by its own disadvantages, including the expense of using additional materials or components. Thus, a new approach is needed which allows the shield can to conform to the PCB without the application of other materials or components.

SUMMARY OF THE INVENTION

The present invention recognizes that in order for a theoretically straight and solid vertical wall of a shield can to conform to the non-planar surface of the PCB the wall must either stretch or buckle. Either action would normally require the application of an extreme amount of force to the wall. However, the amount of this required force can be substantially reduced by providing a plurality of vertical slots in the walls to relieve structural stress. Each of the walls of the shield can would now appear as a series of teeth (alternating metal pieces and vertical slots). A small vertical force can then be applied to the horizontal top surface of the shield can and the top of the can is allowed to bend at the upper edges of the teeth without buckling of the teeth themselves. With the force applied, the teeth will be displaced angularly within adjacent slots to the extent required for their lower edges to conform to the curvature of the PCB surface. In this manner, the shield can will make more consistent or uniform contact (electrical and mechanical contact) with a ground trace on the PCB. To provide for effective air flow through the shield can of the present invention, a plurality of small openings can be made across the top surface of the shield can.

The present invention is to be distinguished from conventional shield cans which have circular openings in the walls for air flow and vertical openings at the corners between walls formed as a result of the manufacturing process. The circular openings in the walls of conventional shield cans could not provide the required stress relief when a force is applied to the top of the shield can because those openings do not extend along the entire height of the wall. Furthermore, while the vertical openings at the corners of conventional shield cans extend along the height of the two adjacent walls, those openings are not within either of the two walls and thus cannot provide the required stress relief. Rather, as taught by the present invention, the required stress relief is provided by the use of at least one vertical slot in each wall of the shield can which needs to make contact with an uneven area on the PCB.

In one aspect, the present invention provides a shield can for radio frequency (RF) shielding of electronic components or circuits mounted on a varying surface of an insulating substrate such as a printed circuit board (PCB). The shield can of the present invention, which is capable Of conforming to any variations in the surface of the insulating substrate, comprises a top dimensioned to fit over the components or circuits and adapted to block the passage of RF energy, and a plurality of sides extending downward from the top of the shield can and also adapted to block the passage of RF energy. At least one of the sides of the shield can has at least one slot dimensioned to allow for angular displacement of at least one portion of the side such that it makes contact with the surface of the substrate when a force is applied to the top of the shield can to bring it into engagement with the substrate.

In another aspect, the present invention provides a method of conforming a metal shield used for shielding RF energy to the varying surface of an electronic substrate used for mounting electronic circuitry which is to be shielded. The shield comprises a top and a plurality of sides and the method comprises the steps of forming in at least one of the sides at least one slot dimensioned to allow at least one portion of the side to be angularly displaced and to make contact with the surface of the substrate when a force is applied to the top of the shield to bring it into engagement with the surface of the substrate, and applying the force to the top of the shield to bring it into engagement with the surface of the substrate.

In yet another aspect, the present invention provides a method for compensating for structural variations in an area on the surface of an insulating substrate having a plurality of electronic components which are to be RF shielded. The method comprises the steps of applying a ground trace to a plurality of points around the perimeter of the area, and forming a metal shield as a top piece and a plurality of side pieces extending downwardly from the top piece with each of the side pieces being formed as a plurality of teeth separated by slots extending substantially the height of the corresponding side piece. The method further comprises positioning the metal shield over the area, and applying a force to the top piece of the metal shield whereby at least some of said teeth are angularly displaced and forcibly made to contact the ground trace points despite any surface variations in the substrate.

In a further aspect, the present invention provides an apparatus for shielding RF energy from travelling out of or into one or more electronic components. The apparatus comprises a PCB having a non-uniform surface on which the components are mounted or deposited, and a shield can for covering the components. The shield can comprises a top and a plurality of side walls. At least one of the side walls has one or more vertical slots of a size sufficient to allow one or more portions of the corresponding wall to be angularly displaced under the pressure of a force applied to the top of the shield can. The apparatus further comprises means for applying the force to the top of the shield can whereby the slotted side walls of the shield can are able to make contact with the non-uniform surface of the PCB.

These and other aspects of the present invention will now be described in more detail with reference to the drawings.

BRIEF DESCRIPTION OF THE DRAWINGS

The present invention will be better understood and its numerous objects and advantages will become apparent to those skilled in the art by reference to the following drawings in which.

DETAILED DESCRIPTION

Figure 1:
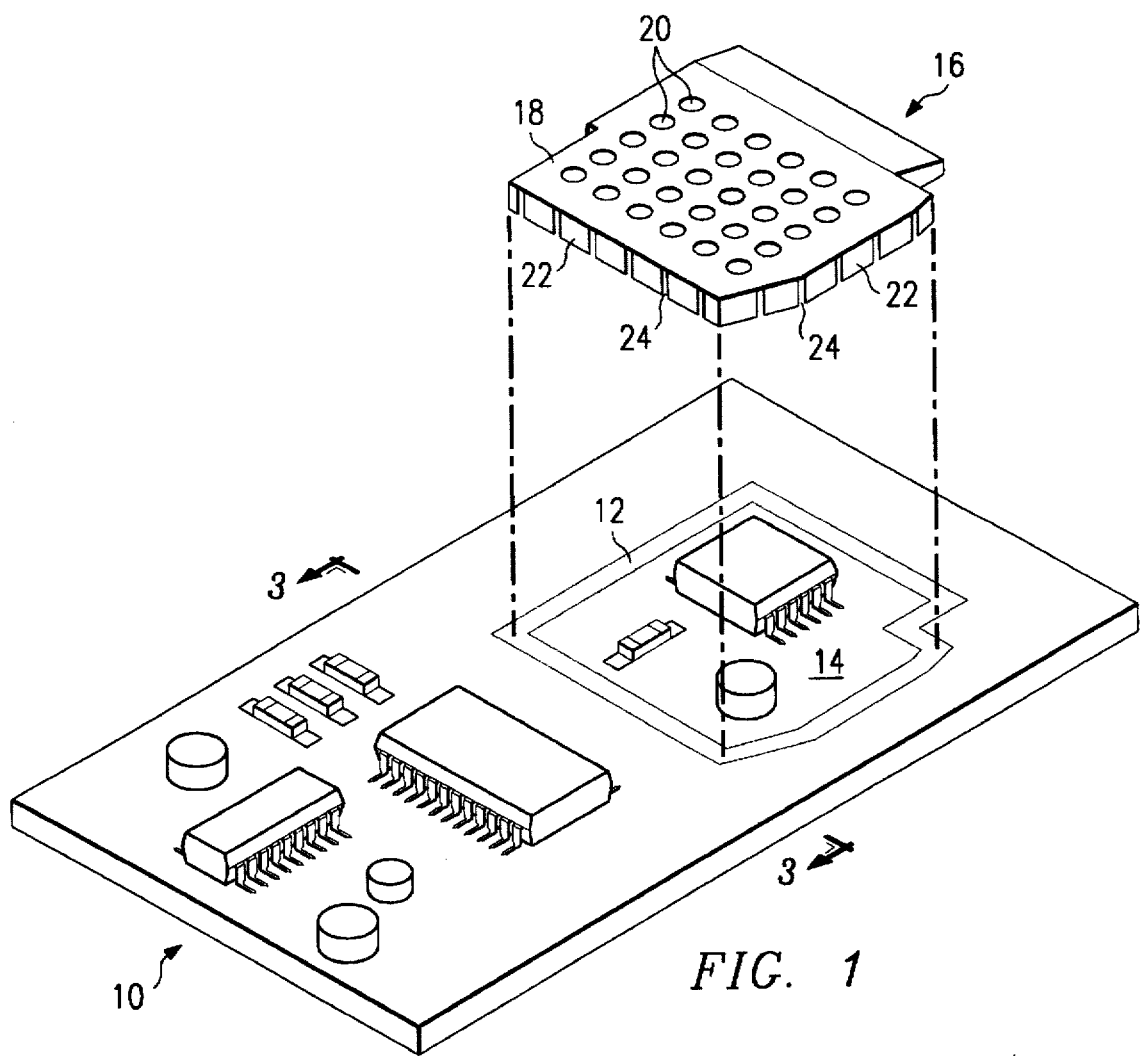
FIG. 1 is a top exploded view of a printed circuit board (PCB) on which the shield can of the present invention may be mounted.

Referring first to FIG. 1, a printed circuit board (PCB) 10 is illustrated as having various electronic components mounted on its upper surface, although it is understood that in practice the PCB 10 may also have at least some components or circuits which are etched in or deposited on its surface rather than being mounted. A ground trace 12 has been deposited around an area 14 on the surface of the PCB 10. The ground trace 12 forms a continuous pattern corresponding to the outline of a shield can 16 which is to be mounted on the PCB 10 (it is understood, however, that a discontinuous ground trace pattern may also be used). The shield can 16 is intended to shield or block radio frequency (RF) energy generated by a plurality of components mounted on (or embedded in) the area 14. Of course, the shield can 16 may also act to block remotely generated RF energy from travelling into the area 14.

As shown in FIG. 1, the shield can 16, which is constructed in accordance with the present invention, comprises a top 18 having a plurality of weight reducing and/or heat dissipating circular openings 20, and further comprises a plurality of side walls each including a plurality of teeth 22 separated by a plurality of vertical slots 24. To avoid leakage of significant RF energy through the openings 20, the diameter of the openings 20 preferably (but not necessarily) should be no more than $\frac{1}{20}$ of the shortest wavelength for the frequencies sought to be shielded by the shield can 16 (of course, the openings 20 may be wider than the preferred size, but this may result in greater leakage of RF energy through the openings 20 than may be desired). The number and position of the slots 24 should be sufficient to relieve the structural stress imposed by a force which is applied to the top 18 of the shield can 16 to bring it into engagement with the PCB 10. Preferably, the length of the slots 24 is substantially equal to the height of the corresponding wall of the shield can 16 such that the slots 24 extend the complete vertical distance of the side walls of the shield can 16. As with the openings 20, the width of the slots 24 preferably (but not necessarily) should be no more than 1/20 of the shortest wavelength for the frequencies sought to be shielded by the shield can 16 (of course, the slots 24 may be wider than the preferred size, but this may result in greater leakage of RF energy through the Slots 24 than may be desired).

Figure 2:
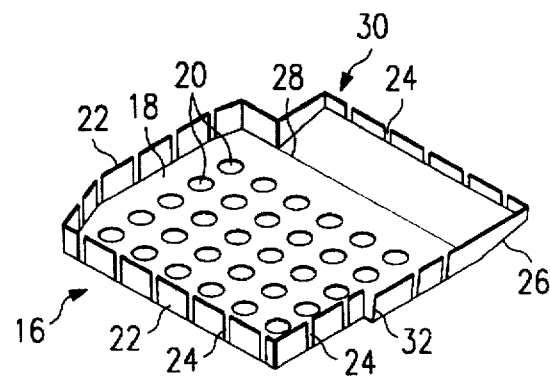
FIG. 2 is a bottom isometric view of the shield can in FIG. 1.

Referring next to FIG. 2, in an illustrative embodiment of the shield can 16, the top 18 comprises a generally horizontal or flat surface including the openings 20 followed by a narrower sloped surface 26 beginning at bend line 28. Consequently, one of the side walls 30 has shorter teeth than the remaining side walls. Further, it will be noted that there is a discontinuity in one of the side walls at a juncture 32. Thus, it will be appreciated that the construction of the shield can 16 is not necessarily symmetrical across any dimension but may be varied to accommodate the needs of a particular application, including the configuration of the components which require shielding.

Figure 3:
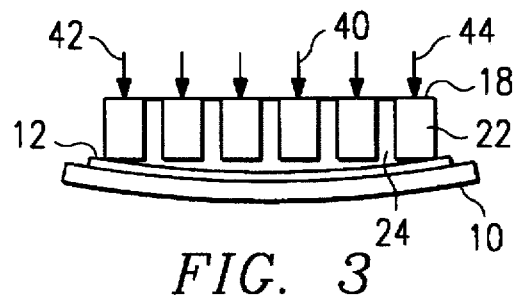
FIG. 3 is a cross sectional view of the PCB and shield can along line 3—3 of FIG. 1 showing an illustrative curvature of the top surface of the PCB.
Figure 4:
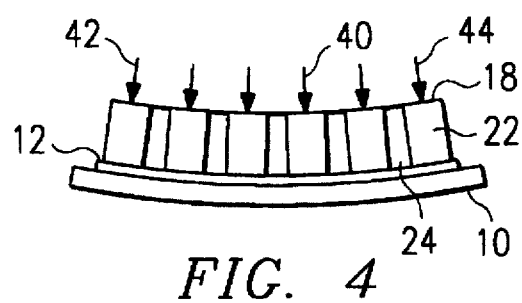
FIG. 4 is a view similar to FIG. 3 but showing the conformity of the shield can to the curvature of the PCB after application of a downward force to the top surface of the shield can.

Referring next to FIGS. 3–4, the surface of the PCB 10 along at least some areas of the ground trace 12 may be curved due to warpage or deterioration as shown in FIG. 3. Nevertheless, as shown in FIG. 4, the teeth 22 of the shield can 16 of the present invention will be able to make consistent contact with the ground trace 12 on the PCB 10 when an external, downward force 40, 42 and 44 is applied to the top 18 of the shield can 16 to bring it into engagement with the PCB 10. The force 40, 42 and 44 may be uniformly applied to the top 18 of the shield can 16 or, alternatively, selectively applied at various points in the top 18. The force 40, 42 and 44 may be applied, for example, by spring loaded contacts, a non-setting flexible foam, rubber or some other resilient material.

Figure 5:
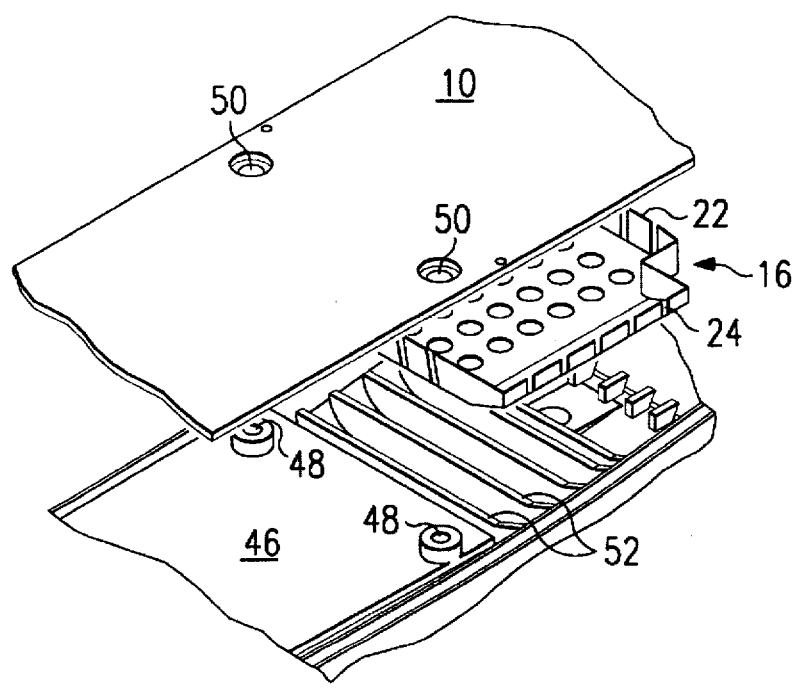
FIG. 5 is a bottom exploded view of the PCB and shield can of FIG. 1, and further showing a housing for the PCB and shield can, the housing acting to provide the force required to engage the shield can with the PCB.

FIG. 5 shows an exemplary arrangement for applying the force 40, 42 and 44 to the shield can 16. In this arrangement, the PCB 10 and the shield can 16 are assembled within a housing 46 having connection receptacles 48, such as threaded openings, for receiving screws or other fasteners inserted through corresponding holes 50 in the PCB 10. When the PCB 10, shield can 16 and housing 46 are assembled, the PCB 10 and the housing 46 are compressed together thereby engaging a plurality of angled ribs 52 in the housing 46 with the top 18 of the shield can 16. The resultant force which is applied by the ribs 52 on the shield can 16 will bring the teeth 22 of the shield can 16 into contact with the PCB 10. It should be noted that, in some applications, it may be desirable to insert non-setting foam between the ribs 52 and the shield can 16 to allow for the absorption of any tolerances in the assembly and to act as a damper.

In general, those skilled in the art will readily recognize that many modifications and variations may be made to the embodiments of the present invention disclosed herein without substantially departing from the spirit and scope of the present invention. Accordingly, the form of the invention disclosed herein is exemplary and is not intended as a limitation on the scope of the invention as defined in the following claims.

I claim:

1. An apparatus comprising:
   an electronic circuit;
   an insulating means having a surface area in which the electronic circuit is situated;
   a ground path means substantially circumscribing said surface area;
   a radio frequency (RF) shield means for covering said electronic circuit, said RF shield means including a top conforming to at least the dimensions of said surface area and downwardly extending sides enclosing said surface area, each of said sides having a plurality of slots extending substantially the full height of that side; and
   a housing means for applying a force to the top of said shield means whereby the sides of said shield means are made to contact said ground path means.

2. The apparatus of claim 1 wherein said insulating means comprises a printed circuit board (PCB).

3. The apparatus of claim 2 wherein said ground path means comprises a ground trace which has been deposited around said surface area on said PCB.

4. The apparatus of claim 1 wherein said shield means is made of metal.

5. The apparatus of claim 1 wherein the width of each of the slots is not greater than 1/20 the wavelength of any frequency being shielded.

6. The apparatus of claim 1 wherein the top of said shield means has a plurality of circular openings.

7. The apparatus of claim 6 wherein the diameter of any of said circular openings is not greater than 1/20 the wavelength of any frequency being shielded.

8. The apparatus of claim 1 wherein said housing means applies different components of said force at different points on the top of said shield means.

9. A method for compensating for structural variations in an insulating substrate having a surface area for mounting a plurality of electronic components which are to be radio frequency (RF) shielded, the method comprising the steps of:
   applying a ground trace to a plurality of points around the perimeter of said area;
   forming a metal shield as a top piece and a plurality of side pieces extending downwardly from the top piece, each of the side pieces being formed as a plurality of teeth separated by slots extending substantially the height of that side piece;
   positioning said metal shield over said area; and
   assembling said metal shield in a housing which applies a force to the top piece of said metal shield whereby at least some of said teeth are angularly displaced and forcibly made to contact the ground trace points despite any surface variations in said substrate.

10. The method of claim 9 wherein said insulating substrate comprises a printed circuit board (PCB).

11. The method of claim 9 wherein the width of each of the slots is not greater than 1/20 the wavelength of any frequency being shielded.

12. The method of claim 9 wherein the top of said shield has a plurality of circular openings.

13. The method of claim 12 wherein the diameter of any of said circular openings is not greater than 1/20 the wavelength of any frequency being shielded.

14. An apparatus comprising:
   an insulating substrate having a varying surface;
   a plurality of electronic components or circuits mounted on said substrate surface;
   a radio frequency (RF) shield can capable of conforming to the variations in said substrate surface, the shield can including a top dimensioned to fit over said components or circuits and adapted to block the passage of RF energy, and a plurality of sides extending downward from the top of said shield can and also adapted to block the passage of RF energy, at least one of said sides having at least one slot extending substantially the full height of said at least one side to allow for angular displacement of at least a portion of said at least one side such that it makes contact with the surface of said substrate when a force is applied to the top of said shield can to bring it into engagement with said substrate; and a housing which applies said force to the top of said shield can.

15. The shield can of claim 14 wherein the width of said at least one slot does not exceed 1/20th the wavelength of any frequency of the RF energy being blocked.

16. The shield can of claim 14 wherein said sides make contact with a ground trace deposited on said substrate.

17. The shield can of claim 14 wherein the shield can is made of metal and the substrate comprises a printed circuit board (PCB).

18. A method of conforming a metal shield used for shielding radio frequency (RF) energy to an insulating substrate used for mounting electronic circuitry to be RF shielded, said substrate having a varying surface on which said circuitry is mounted, said shield comprising a top and a plurality of sides, the method comprising the steps of:

forming in at least one of said sides at least one slot extending substantially the full height of said at least one side to allow at least one portion of said at least one side to be angularly displaced and to make contact with the surface of said substrate when a force is applied to the top of said shield to bring it into engagement with the surface of said substrate; and assembling said shield in a housing which applies said force to the top of said shield to bring it into engagement with the surface of said substrate.

19. The method of claim 18 wherein the width of said at least one slot does not exceed 1/20th the wavelength of any frequency of the RF energy being shielded.

20. The method of claim 18 wherein said sides make contact with a ground trace deposited on said substrate.

21. The method of claim 18 wherein the shield is made of metal and the substrate comprises a printed circuit board (PCB).

22. A method for shielding radio frequency (RF) energy in a printed circuit board (PCB) having a surface on or in which a plurality of electronic components or electrical circuits are mounted, the method comprising the steps of:

providing a shield can comprised of a top portion and a plurality of side portions, each of said side portions being formed as a plurality of teeth separated by at least one slot extending substantially the full height of that side portion, said teeth being adapted to relieve structural stress in the side portions caused when a force is applied to said top portion to bring said shield can into engagement with said PCB, thereby allowing said shield can to conform to any structural variations in the surface of said PCB;

positioning said shield can relative to said PCB such that said shield can covers said components or circuits when said force is applied; and assembling said shield can in a housing which applies said force to said shield can.

23. The method of claim 22 wherein said top portion of said shield can is generally flat and said side portions are generally straight.

24. The method of claim 22 wherein the width of each of said slots is less than 1/20 of the wavelength of any frequency being shielded.

25. The method of claim 22 wherein said top portion has a plurality of openings for air flow.

26. The method of claim 25 wherein the width of each of said openings is less than 1/20 of the wavelength of any frequency of the RF energy being shielded.

27. An apparatus for shielding radio frequency (RF) energy from travelling out of or into one or more electronic components comprising:

a printed circuit board (PCB) having a non-uniform surface on which said components are mounted or deposited;

a shield can covering said components, said shield can comprising a top and a plurality of side walls, at least one of the side walls having one or more vertical slots extending substantially the full height of said at least one side wall to allow one or more portions of said at least one side wall to be angularly displaced under the pressure of a force applied to the top of said shield can; and a housing means for applying said force to the top of said shield can whereby the slotted side walls of the shield can are able to make contact with the non-uniform surface of the PCB.

28. The apparatus of claim 27 wherein the top portion of said shield has a plurality of openings for air flow.

29. The apparatus of claim 28 wherein the width of said openings is less than 1/20 of the wavelength of any frequency of the RF energy being shielded.

30. The apparatus of claim 27 wherein the width of each of said slots is less than 1/20 of the wavelength of any frequency being shielded.

31. The apparatus of claim 27 wherein said shield can is made of metal.

* * * * *